US005146892A

United States Patent [19]

Krampe et al.

[11] Patent Number: 5,146,892

[45] Date of Patent: Sep. 15, 1992

[54] METHOD AND ARRANGEMENT FOR THE OPEN-LOOP AND/OR CLOSED-LOOP CONTROL OF THE ENGINE POWER OF AN INTERNAL COMBUSTION ENGINE OF A MOTOR VEHICLE

[75] Inventors: Wolfgang Krampe, Seoul, Rep. of Korea; Bernd Lieberoth-Leden, Leonberg, Fed. Rep. of Germany

[73] Assignee: Robert Bosch GmbH, Stuttgart, Fed. Rep. of Germany

[21] Appl. No.: 671,858

[22] Filed: Apr. 4, 1991

[30] Foreign Application Priority Data

Aug. 4, 1989 [DE] Fed. Rep. of Germany ....... 3925881

[51] Int. Cl.[5] ........................ F02D 11/10; F02D 41/22

[52] U.S. Cl. ................................ 123/399; 123/198 D

[58] Field of Search .................... 123/399, 479, 198 D

[56] References Cited

U.S. PATENT DOCUMENTS 4,305,359 12/1981 Mann et al. ......................... 128/333
4,601,199 7/1986 Denz ................................. 73/118.1
4,644,922 2/1987 Glöckler et al. .................... 123/493
4,905,645 3/1990 Bonse et al. .................... 123/198 D
4,960,087 10/1990 Junginger et al. ............ 123/198 D
4,969,431 11/1990 Wataya .............................. 123/399

FOREIGN PATENT DOCUMENTS 3621937 1/1988 Fed. Rep. of Germany .
3808382 9/1989 Fed. Rep. of Germany .

OTHER PUBLICATIONS

Patent Abstracts of Japan, 009-209 (M407), Aug. 27, 1985.

*Primary Examiner*—Tony M. Argenbright
*Attorney, Agent, or Firm*—Walter Ottesen

[57] ABSTRACT

A method and an arrangement for the open-loop and/or closed-loop control of the engine power of an internal combustion engine of a motor vehicle is suggested. For checking a safety function, the arrangement intervenes in the fuel metering in the sense of reducing engine speed when an operating condition critical to safety is present. This safety function is triggered in the overrun operation of the internal combustion engine independently of the safety condition and the correct performance is checked. The safety function is detected as being defective when a unlimited metering of fuel takes place in this operating condition when the safety function is triggered.

14 Claims, 4 Drawing Sheets

METHOD AND ARRANGEMENT FOR THE OPEN-LOOP AND/OR CLOSED-LOOP CONTROL OF THE ENGINE POWER OF AN INTERNAL COMBUSTION ENGINE OF A MOTOR VEHICLE

FIELD OF THE INVENTION

The invention relates to a method and an arrangement for the open-loop and/or closed-loop control of the engine power of an internal combustion engine of a motor vehicle. The desire of the driver is electronically transmitted to an engine power actuating element with a safety function becoming effective when there is an operating condition critical to safety in the area of the open-loop control and/or the closed-loop control by intervening in the metering of fuel in the sense of reducing engine speed.

BACKGROUND OF THE INVENTION

One such method or arrangement is known from U.S. Pat. No. 4,305,359. There, an electronic accelerator pedal system is described, which recognizes an operational condition of the system critical to safety by a comparison of the accelerator pedal position and the actuator position, when, for example, the actuator is in its gas position and the accelerator pedal is in the idle position. Such an operating condition can occur when the actuator is jammed. In accordance with U.S. Pat. No. 4,305,359, the engine speed or power of the engine is reduced when the safety condition is recognized in that an aggregate influencing the engine speed of the internal combustion engine is driven in the sense of a reduction of engine speed. In this connection, the supply of fuel to the engine is interrupted. A disadvantage of this kind of procedure is that a failure of this safety function is not detectable and, in the safety situation for an open power actuator, the electronic accelerator pedal system can accelerate the vehicle uncontrolled notwithstanding active safety function.

A method for controlling the internal combustion engine in overrun operation is known from U.S. Pat. No. 4,644,922 wherein, for detected overrun operation, the fuel supply is switched off above a limit engine speed which changes as a function of time. In this connection, the overrun operation is then present when the actuator or accelerator pedal is in the idle position.

SUMMARY OF THE INVENTION

The invention then has the object to undertake a check of the availability of this safety function for improving operating safety of a motor vehicle with a safety function of the above-mentioned type. This object is realized in that during specific operating phases of the engine, the safety function is triggered independently of the safety situation and the correct execution of the safety function is checked.

The solution according to the invention has the advantage that the safety function can be continuously checked as to its trouble-free operation even during operation of the motor vehicle and a malfunction of the safety function can be detected in time so that a functioning safety function can be utilized in an actually occurring safety condition.

A further advantage of the concept of the invention is seen in that the check of the safety function, that is the triggering of the safety function for test purposes in overrun operation of the engine, neither influences drivability nor exhaust gas and therefore is not noticed by the driver.

Further advantages become evident from the description of the following embodiments in connection with the dependent claims.

BRIEF DESCRIPTION OF THE DRAWINGS

The invention will be explained below with respect to the embodiments illustrated in the drawings. FIG. 2 describes a flowchart for explaining the procedure of the invention while

DESCRIPTION OF THE PREFERRED EMBODIMENTS OF THE INVENTION

Figure 1:
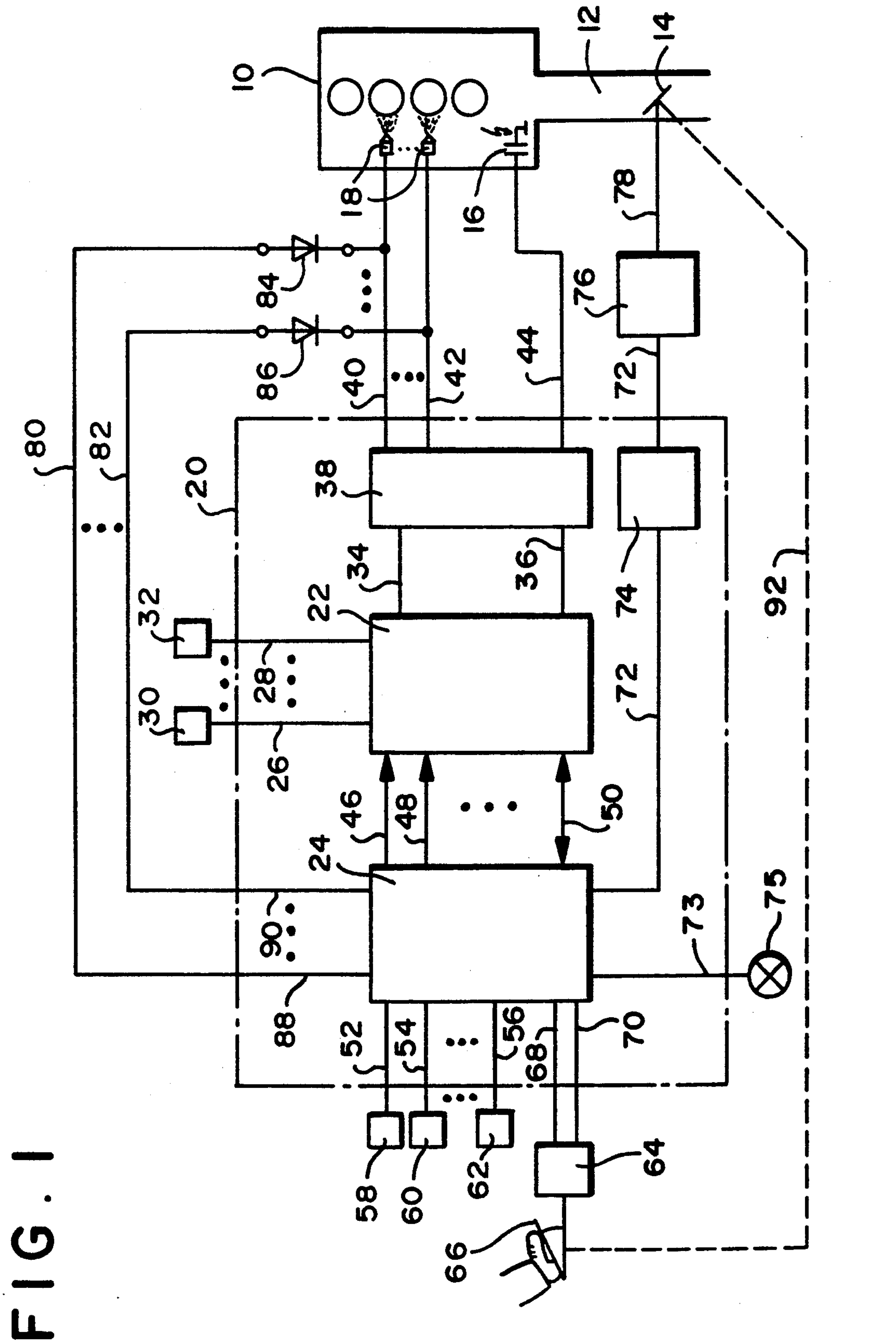
FIG. 1 shows a block diagram of an engine control system selected because it provides a good overview.

FIG. 1 shows an internal combustion engine 10 illustrated symbolically having an intake pipe 12 in which a throttle flap 14 is disposed. In addition, the engine includes an ignition arrangement 16 as well as at least one fuel-metering arrangement 18. Of course, the injection unit can be configured as a cylinder-specific injection as well as a central injection and the internal combustion engine can include a bypass bridging the throttle flap for controlling idle engine speed.

An engine control system 20 is shown in phantom outline in FIG. 1. This engine control system comprises essentially two units, an engine control unit 22 by means of which the engine parameters: fuel-metering, ignition and/or idle speed can be controlled as well as an electronic engine power control 24 which is used for the control of the throttle flap 14 in dependence upon the desire of the driver as well as for adjusting the idle engine speed.

The engine control unit 22 is connected to measuring arrangements 30 to 32 of the engine and of the motor vehicle via input lines 26 to 28 for measuring operating characteristic data. These measuring arrangements, not shown completely in FIG. 1, transmit to the engine control unit 22 for example engine speed signals, measurement values for the air mass or air quantity, engine temperature, exhaust-gas composition and/or similar operating characteristic data known from the state of the art. The engine control unit 22 computes the quantity of fuel to be metered from these input variables and/or the suitable ignition time point and/or the position of the idle actuator. In FIG. 1, the engine control unit 22 is connected symbolically via its output lines 34 and 36 to the driver stage 38 which controls via its connecting lines 40 to 42 the fuel-metering units 18 corresponding to the computed fuel quantity to be metered as well as being connected via its output lines 44 to the ignition unit 16. The connecting lines 40 to 42 (or by the feedback lines 80 to 82 described further below) it is intended to express that the inventive concept can find application with a central injection unit having one connecting line as well as for cylinder-specific injection units having two or more cylinders (and a corresponding line number). The engine control unit 22 is supplied with an idle speed signal 46 from the accelerator pedal or throttle flap and a safety actuating signal 48 via the connecting lines 46, 48 and 50 which connect the engine control unit 22 to the electronic engine power control 24. The connecting line 50 symbolically represents an exchange of data between engine power control 24 and engine control unit 22 which are necessary in the particular unit for solving its task.

The electronic engine power control system 24 is connected via its input lines 52 and 54 to 56 to measuring arrangements such as: one or more throttle flap potentiometers 58 for determining the throttle flap position; an arrangement 60 for measuring the road speed; and/or with an idle switch 62 of the throttle flap 14. In addition, the position of the accelerator pedal 66 is supplied via the input lines 68 to the electronic engine power control system 24 via one or more accelerator position potentiometers and a signal which represents the idle position of the accelerator pedal is supplied via the input line 70 to the electronic engine power control system 24. The electronic engine power control system 24 influences via its output line 72 and its driver stage 74 the position of the actuator 76 in dependence upon these input signals. The actuator 76 is connected to the throttle flap 14 via connection 78 which is rigid so as to permit rotation of the throttle flap with the actuator. The connecting lines 40 to 42 for driving the fuel-metering devices 18 are connected via feedback lines 80 to 82 wherein measuring arrangements represented by diodes 84 to 86 are disposed which detect the function or drive of the fuel-metering devices 18 and which supply this information via input lines 88 to 90 to the electronic engine power control 24. The electronic connection "accelerator pedal 66 - throttle flap 14" can have a mechanical connection superposed thereon as represented by the dotted line in FIG. 1 which can take over an emergency operation when there is a fault of the electronic control.

The embodiment illustrated here in the context of an Otto engine does not limit the inventive concept to this engine type. For applications to diesel engines, the throttle flap is understood to mean the control rod controlling the quantity of fuel. In addition to the control function, the electronic engine power control system 24 conducts a function check of its components and of itself pursuant to procedures known in the state of the art. For example, in this way corresponding to the known state of the art, a defect for an opened throttle flap and accelerator pedal in the idle position are detected. Further defect sources can include the potentiometer itself or the electronic equipment of the control system. The electronic engine power control system 24 reacts to the detected defect by setting the safety request signal 48 which is supplied to the engine control unit 22. The engine control unit 22 then switches off the fuel metering to the engine with highest priority with respect to its other control functions. Preferably, the fuel switchoff takes place above a pregiven engine speed, typically 1,000 to 2,000 rpm; whereas, below this engine speed, fuel is supplied in order to make it possible to maintain an emergency operation and keep the ancillary aggregates operational. Advantageously, and especially for diesel engines, would be a reduction of the fuel metered to a pregiven emergency quantity in lieu of a switchoff.

A monitoring of this safety function during operation of the engine is then attained in that the electronic engine power control 24 sets the safety request signal 48 for test purposes. The electronic engine power system can check the correct execution of the safety request via the connection 80 to 82. In this way, the end stage outputs or the drive lines for the metering units 18 are connected to the inputs 88 to 90 of the electronic engine power control via a so-called wire-OR connection represented by the diodes 84 to 86. Furthermore, in another advantageous embodiment, the course of the signals in the drive lines can be checked. If a defective safety function is determined during a check, the electronic engine power control 24 forms an alarm signal via its output line 73 to trigger a suitable defect reaction. This defect reaction is preferably realized in a mechanical emergency operation via the mechanical connection 92, in a power reduction by limiting the throttle-flap angle or in the warning lamp 75 shown in FIG. 1 as exemplary.

Preferably, the check of the safety function is carried out during the overrun operation since, in this operational phase, the engine control unit 22 carries out the overrun cutoff as known from the state of the art. In this way, negative influences on the driving performance or on the driver are precluded. The overrun operational phase is detected by the engine control unit by means of an idle position signal applied via the connecting line 46, that is an accelerator pedal or throttle flap in the idle position, a speed condition $n > n0$ and possibly in dependence upon further operating parameters of the engine such as engine temperature. If the safety request takes place during the overrun phase, then a precise assignment of the fuel cutoff to the idle position signal or to the safety request signal is carried out in order that a precise monitoring of the safety function referred to above is ensured. This procedure is illustrated with respect to the flowchart of FIG. 2 to facilitate understanding.

Figure 2:
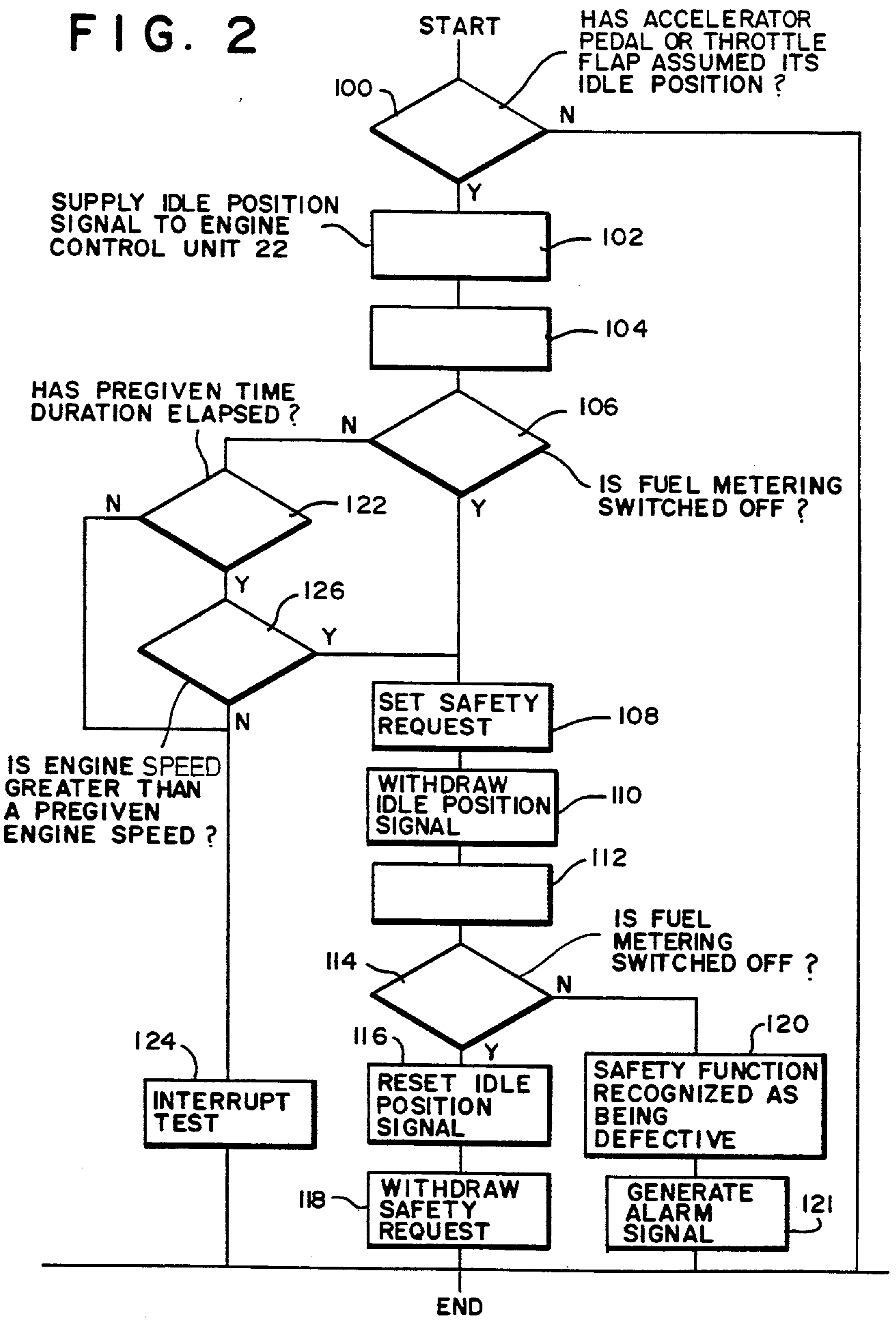

After the start of the program part shown in FIG. 2 and carried out in the engine power control 24, a check is made in inquiry block 100 as to whether the accelerator pedal or throttle flap has assumed its idle position. The program part is terminated in response to a negative answer whereas in the positive case, the idle position signal is supplied via the connecting line 46 to the engine control unit 22 (102). The reaction time 104 is essentially determined by the computation time of the engine control unit 22. After this pregiven reaction time 104 has run, a check is made in the inquiry block 106 as to whether the fuel metering is switched off. If an interrupted fuel metering is detected in block 106, then the safety request is set pursuant to block 108 and the idle position signal is withdrawn in the next function block 110. After the renewed reaction time 112 has run, a check is again made as to whether or not the fuel metering is switched off (inquiry block 114). The fuel switchoff determined with a functionally operational safety function in inquiry block 114 is based on the safety request signal corresponding to the measures of blocks 108 and 110. That is, in block 116, the determination can be made that the safety function is in order and the test can be successfully terminated in that the idle position signal is again set and the safety request is withdrawn (118). If fuel metering is determined in inquiry block 114, then: the safety function is recognized in block 120 as being defective; an alarm signal is generated in block 121; and, the program part is likewise terminated.

The data which form the basis of the decisions in inquiry blocks 106 and 114 are supplied to the electronic engine power control 24 via the wire-OR connection described above and the input lines 88 to 90.

After the idle position (blocks 102 to 104) has been detected, the determination can be made in the above-described inquiry block 106 as a second possibility that fuel is being metered. Accordingly, the inquiry is made in block 122 which is not perforce present but advantageously present whether, since the last successful test, a pregiven time duration, for example 15 minutes, has passed. If this is not the case, then a closer investigation can be dispensed with and the test is discontinued in block 124 and the program part terminated. If this time duration since the last successful test is however exceeded, then a check of the safety function is forced (notwithstanding the fact that the fuel has not been shut off) via the inquiry block 126, which compares the instantaneous engine speed to a pregiven engine speed (for example 2,000 rpm). However, the condition of the inquiry block 126 that the engine speed is greater than a pregiven threshold engine speed must be fulfilled. In the other case, the test corresponding to block 124 is interrupted and the program part terminated. The pregiven threshold engine speed of the inquiry block 126 corresponds to a lower safety engine speed threshold below which no fuel cutoff can take place or fuel cutoff can take place only under certain conditions in order to prevent an immediate standstill of the engine or to not substantially deteriorate the driving comfort.

Figure 3:
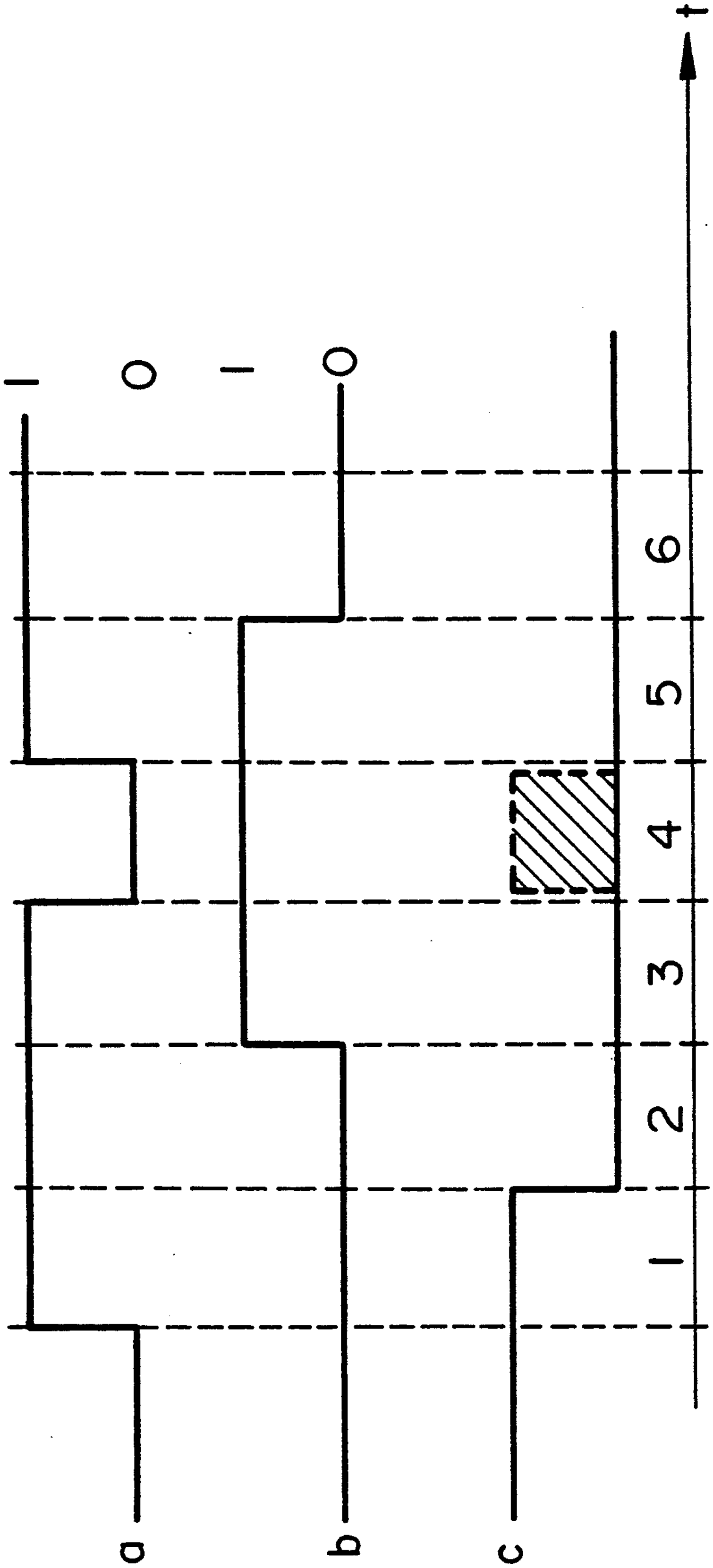
FIG. 3 shows a time diagram of the course of the signals occurring when carrying out the method of the invention and FIG. 4 describes advantageous further embodiments of the inventive concept.

A further clarification of the procedure according to the invention is obtained from the time diagram shown in FIG. 3. FIG. 3*a* describes the time-dependent signal response of the idle position signal transmitted on the connecting line 46. FIG. 3*b* shows the signal response of the safety request signal transmitted on connecting line 48 and FIG. 3*c* shows the performance of the fuel metering. In time direction, the time diagram is subdivided into six phases to improve understanding. Phase 1 is characterized by the occurrence of the idle position signal and the cutoff of the fuel metering after a pregiven reaction time above an engine speed threshold, the so-called cutoff engine speed threshold. This phase characterizes the start of the overrun operation. In phase 2, the electric engine power control 24 detects the completed cutoff via its inputs 88 to 90; whereas, the control 24 emits in phase 3 the signal "safety request" to the engine control unit in order to simulate an operating condition critical to safety. Finally, in phase 4, the idle position signal is withdrawn by the electronic engine power control 24 in order to check the safety function and a check is made as to whether the fuel continues to remain cut off because of the safety request signal. In phase 5, the idle speed signal of the electronic engine power control is set and after a reaction time has run, the safety request is withdrawn in phase 6. The fuel metering remains cut off because of the overrun switch function. The defective operation of the safety function is then detected when, in phase 4, a metering of the fuel takes place (phantom outline).

The signal level of the time traces shown in FIG. 3 is formed by digital 0–1 signals.

If the safety function does not trigger a fuel cutoff, but only a reduction, then a defective function is detected in phase 4 if the fuel metering takes place unrestrictedly. In this case, the test of the safety function is not limited to the overrun operation.

Figure 4:
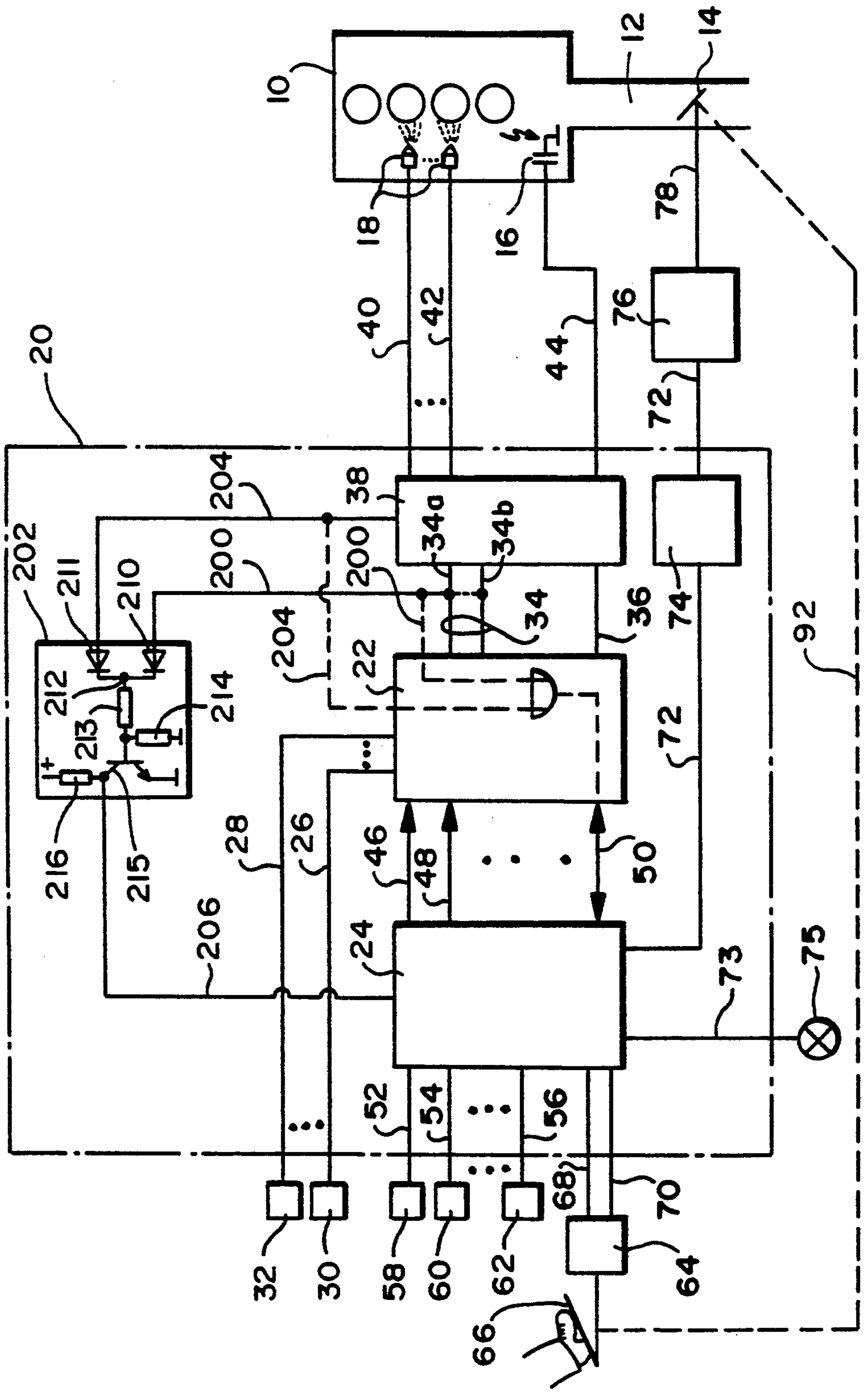

FIG. 4 illustrates further advantageous realization forms of the concept according to the invention. To expedite matters, a complete explanation is not provided with respect to the individual elements discussed in FIG. 1 and having the same reference numerals in FIG. 4 and an explanation is also not provided with respect to the functions of the arrangement explained above. The explanations with respect to FIG. 4 are therefore limited to the differences with respect to the embodiment of FIG. 1 which only relate to the return of information to the electronic engine power control 24.

The output line 34 is illustrated symbolically in FIG. 1 and leads from the engine control unit 22 to the driver stage 38. The output line functions as a carrier of various information. For example, information with respect to the length of the necessary injection pulse flows over the line 34*a;* whereas, the line 34*b* conducts a cutoff or reset signal to the driver stage 38 by means of which a fuel cutoff is carried out.

For monitoring the safety function illustrated above, it is also possible to utilize the data of the output line 34. A line 200 connects the lines 34 with the element 202 or (shown in phantom outline) with the engine control unit 22. The line 200 transmits a signal when the engine control unit effects fuel cutoff.

In addition, a line 204 is provided which connects the element 202 with the driver stage 38 which, alternatively, is connected with the engine control unit 22. This line carries a fault signal which is formed pursuant to methods known from the state of the art and a fault condition of the driver stage 38 such as short circuits or fault functions of the valve controls are announced.

In the engine control unit or the element 202, the lines 200 and 204 or their signals are logically OR connected. The result of this OR-connection in the engine control unit 22 is applied via the data exchange line 50 to the electronic engine power control 24. By applying the element 202 for connecting the lines 200 and 204, the electronic engine control 24 is supplied with a signal corresponding to the logic-OR connection via the line 206 connecting the two units (202 and 24).

If a safety request 48 is set by the electronic engine control corresponding to the method according to the invention, then the control can detect the availability of the safety function by means of the signals supplied to the control as explained above. If a signal is present on the line 206 (alternately 50) during the set safety request, then this means that the fuel cutoff has not taken place or that the driver stage 38 has a fault. The electronic engine power control 24 then detects therefrom that the safety function is not available and sets an alarm signal via its output line 73.

An embodiment of the element 202 is described in the following. The lines 200 and 204 are led to element 202 via two diodes 210 and 211 having cathodes connected together at a connecting point 212 at which a resistor 213 is connected. The resistor 213 is connected at its other end to a resistor 214 which is connected to ground. In addition, the resistors 213 and 214 are connected with the base of a transistor 215 having an emitter connected to ground and having a collector connected to line 206 and connected via a further resistor 216 to the operating voltage. When a signal is applied to line 200 or 204, one or both diodes 210 and 211 is rendered conductive whereby the transistor 215 is likewise conductive and a signal representing a fault condition appears on line 206. The element 202 thereby operates as a logic-OR gate.

We claim:

1. A method for control of the engine power of an internal combustion engine of a motor vehicle wherein said control is at least one of open-loop control and closed-loop control, with the driver's desire being electronically transmitted to an engine power actuating element and with a safety function becoming effective when there is an operating condition critical to safety in the area of said control which intervenes on the metering of fuel in the sense of reducing engine speed, the method comprising the steps of:

checking the safety function by triggering the safety function during a pregiven operational phase of the engine independently of an operating condition critical to safety; and, checking the correct performance of the safety function.

2. The method of claim 1, wherein the safety function is triggered independently of the operational condition critical to safety in the overrun operational phase when there are fuel cut-off conditions.

3. The method of claim 1, wherein the safety function is detected as being defective when fuel is metered when a safety function is triggered independently of the operating condition critical to safety.

4. Method of claim 2, wherein fuel is cut off with a detected idle position of the accelerator pedal or engine power actuator element and with an engine speed which is above a pregiven engine speed threshold.

5. The method of claim 1, wherein the safety function is triggered independently of the operational condition critical to safety when the idle position of the accelerator pedal or the throttle flap is detected and the fuel is cut off.

6. The method of claim 1, further comprising the steps of: detecting an idle position; detecting the cut-off of the fuel metering; triggering the safety function; removing the idle position signal; detecting whether fuel cut-off take place as a consequence of the safety function; and, triggering a fault reaction when fuel metering takes place.

7. The method of claim 1 wherein, after a pregiven time duration since the last successful test when fuel cut-off was present, the safety function is triggered when fuel is metered.

8. The method of claim 1, wherein the safety function causes a cut-off of the fuel.

9. The method of claim.1, wherein the safety function causes a reduction of the metered fuel quantity and a defective operation is detected by means of an unlimited metering of fuel.

10. The method of claim 6, wherein the fault reaction comprises a transition to mechanical control of the throttle flap with at least one of a reduction in power of the internal combustion engine and an actuation of a warning light.

11. An arrangement for the control of the engine power of an internal combustion engine of a motor vehicle equipped with an electronic accelerator pedal system wherein said control is at least one of open-loop control and closed-loop control, the arrangement comprising:

a safety device for intervening in the fuel metering in the sense of reducing engine speed when a condition critical to safety is detected;

means for detecting such an operating condition critical to safety;

means for influencing the fuel metering;

means for activating the safety arrangement during pregiven operating phases of the internal combustion engine independently of the operating condition critical to safety; and, means for checking the function of the safety arrangement.

12. The arrangement of claim 11, further comprising means for detecting an overrun operation and for determining the fuel cut-off condition with the check of the safety arrangement taking place in the overrun operation and when the fuel is cut off.

13. The arrangement of claim 11, wherein the safety arrangement is defective when unlimited fuel is metered while the safety arrangement is activated.

14. The arrangement of claim 11, wherein the electronic accelerator pedal system is connected to the fuel-metering means by one of a wire-OR connection and logic-OR connection for checking the correct function of the safety arrangement.

* * * * *

UNITED STATES PATENT AND TRADEMARK OFFICE
CERTIFICATE OF CORRECTION

PATENT NO. : 5,146,892

DATED : September 15, 1992

INVENTOR(S) : Wolfgang Krampe and Bernd Lieberoth-Leden

It is certified that error appears in the above-identified patent and that said Letters Patent is hereby corrected as shown below:

In the title page, item [22], please delete:

"Filed: Apr. 4, 1991" and substitute:

-- PCT filed: July 7, 1990 -- therefor.

In the title page, item [86], please insert:

-- [86] PCT No.: PCT/DE 90/00506

§ 371 Date: April 4, 1991

§ 102(e) Date: April 4, 1991 --.

In column 7, line 30: delete "take" and substitute -- takes -- therefor.

Signed and Sealed this

Fifth Day of October, 1993

Attest:

BRUCE LEHMAN

Attesting Officer

Commissioner of Patents and Trademarks